United States Patent

Nagashima et al.

[11] Patent Number: 5,920,246
[45] Date of Patent: Jul. 6, 1999

[54] SUPERCONDUCTIVE COMPOSITE MATERIALS

[75] Inventors: Ken Nagashima, Hachioji; Naomichi Sakai, Funabashi; Sang-Im Yoo, Kokubunji; Hiroyuki Fujimoto, Hachioji; Masato Murakami, Kamakura, all of Japan

[73] Assignees: International Superconductivity Technolgy Center; Railway Technical Research Institute, both of Japan

[21] Appl. No.: 08/825,700

[22] Filed: Mar. 19, 1997

[30] Foreign Application Priority Data

Mar. 22, 1996 [JP] Japan .................................. 8-065596

[51] Int. Cl.[6] .................................................. H01F 1/00
[52] U.S. Cl. ............................................ 335/216; 505/776
[58] Field of Search ..................................... 335/216, 296, 335/300; 505/771, 772, 775, 776, 779, 780

[56] References Cited

U.S. PATENT DOCUMENTS

| | | | |
|---|---|---|---|
| 4,190,817 | 2/1980 | Rabinowitz | 335/216 |
| 4,692,088 | 9/1987 | Micheli et al. | 505/742 |
| 5,444,425 | 8/1995 | Hermann | 335/216 |
| 5,525,584 | 6/1996 | Murakami et al. | 505/450 |
| 5,650,376 | 7/1997 | Badaye et al. | 505/701 |

FOREIGN PATENT DOCUMENTS

| | | |
|---|---|---|
| 0340860 | 8/1989 | European Pat. Off. . |
| 9218992 | 10/1992 | WIPO . |

OTHER PUBLICATIONS

Superconductivity, The New Alchemy, John Langone, pp. 81–83, 1989.
Advances in Superconductivity ISTEC, K. Kitazawa and T. Ishiguro (EDS.), Nagoya, Aug. 1988.

*Primary Examiner*—Lincoln Donovan
*Attorney, Agent, or Firm*—Lorusso & Loud

[57] ABSTRACT

A composite material having a plurality of sections integrated into a unitary structure and each including a bulk of a superconductive metal oxide of RE—Ba—Cu—O wherein RE represents a rare earth element, the bulk of each of the sections having pinning centers and capable of trapping a magnetic field. A first one of the sections has a superconductive current density different from that of a second one of the sections. The composite material may be produced by assembling preformed respective sections into a unitary structure or by immersing one of the sections in a solution to grow crystal of Y—Ba—Cu—O superconductive on that section, followed by trimming.

13 Claims, 7 Drawing Sheets

SUPERCONDUCTIVE COMPOSITE MATERIALS

BACKGROUND OF THE INVENTION

This invention relates to a superconductive composite material useful as a superconductive magnet, etc. and a method of producing such a composite material.

Figure 9:
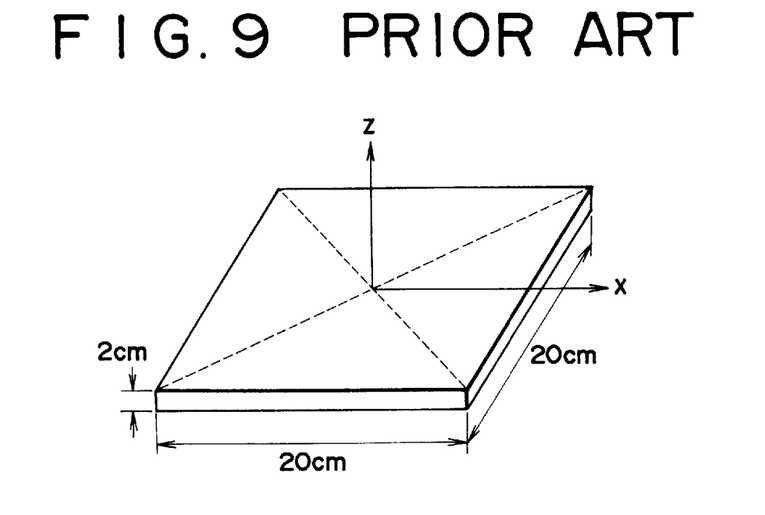
FIG. 9 is a perspective view showing a known superconductive plate.
Figure 10:
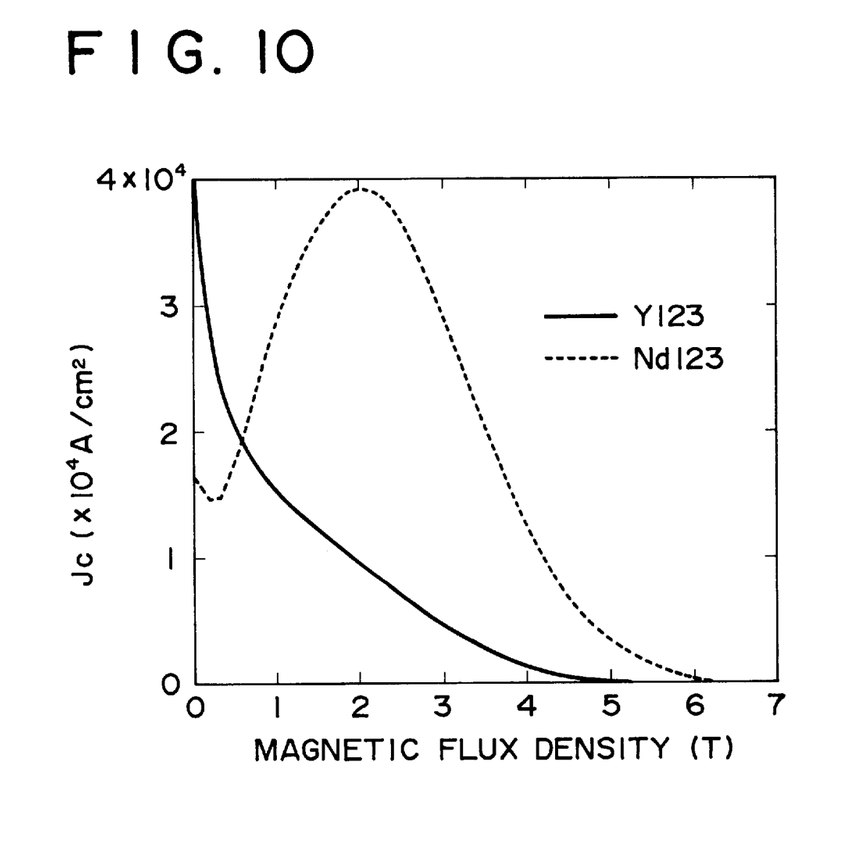
FIG. 10 shows Jc-B curves of superconductive metal oxides Nd123 and Y123.
Figure 11:
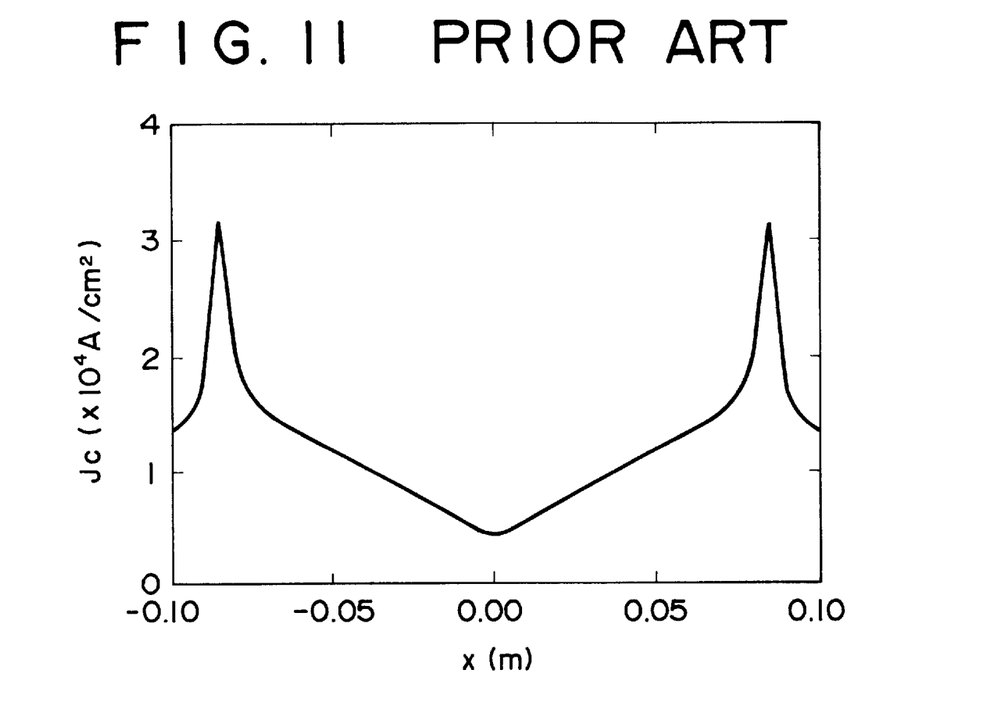
FIG. 11 is a graph showing a critical current density distribution of the Y123 superconductive plate of FIG. 9.
Figure 12:
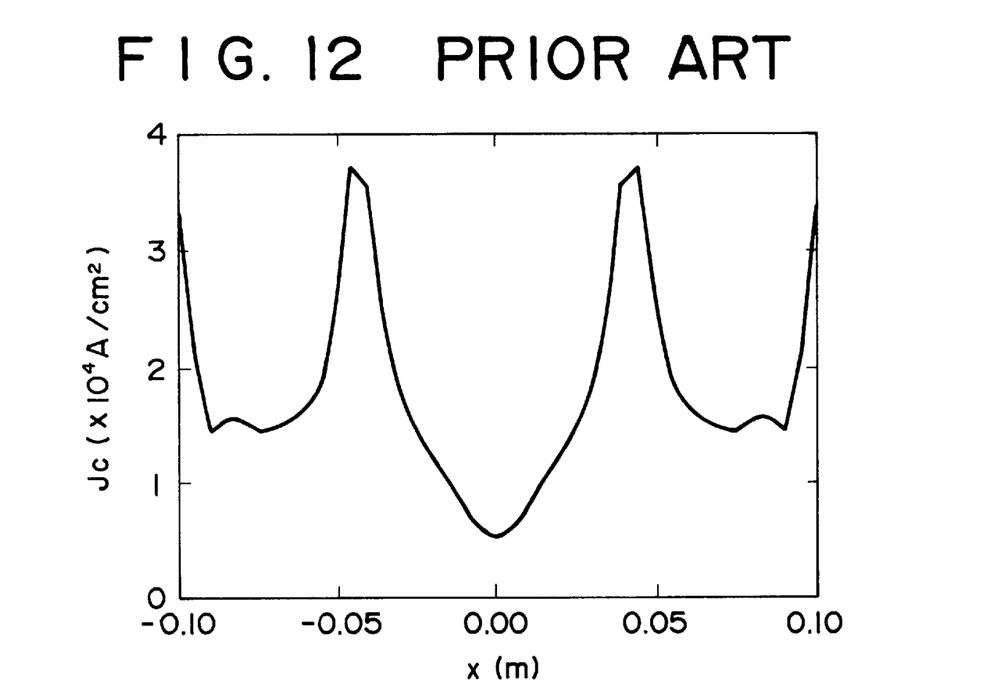
FIG. 12 is a graph showing a critical current density distribution of the Nd123 superconductive plate of FIG. 9.
Figure 13:
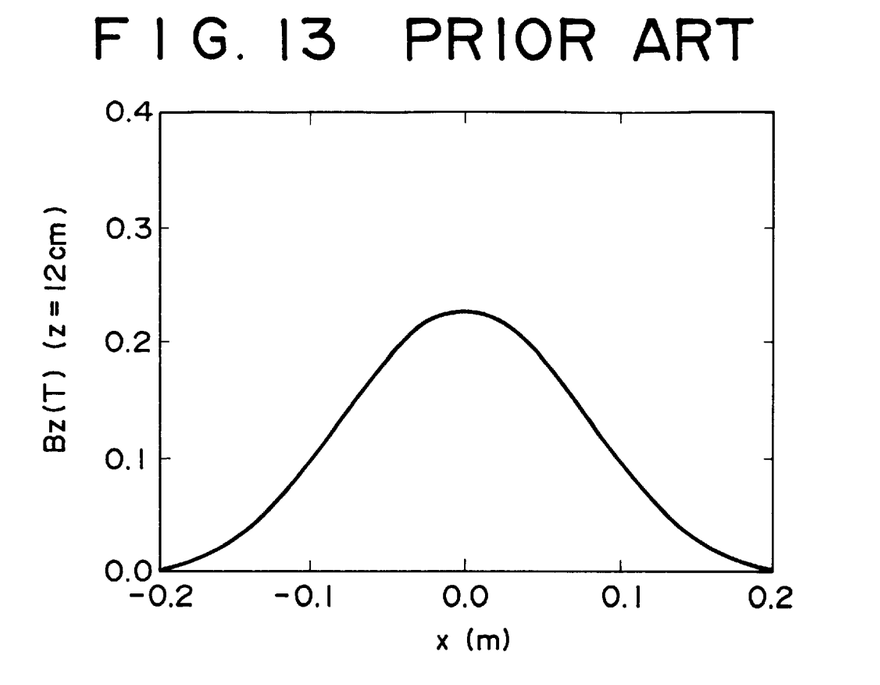
FIG. 13 is a graph showing a trapped magnetic field distribution of the Y123 superconductive plate of FIG. 9.
Figure 14:
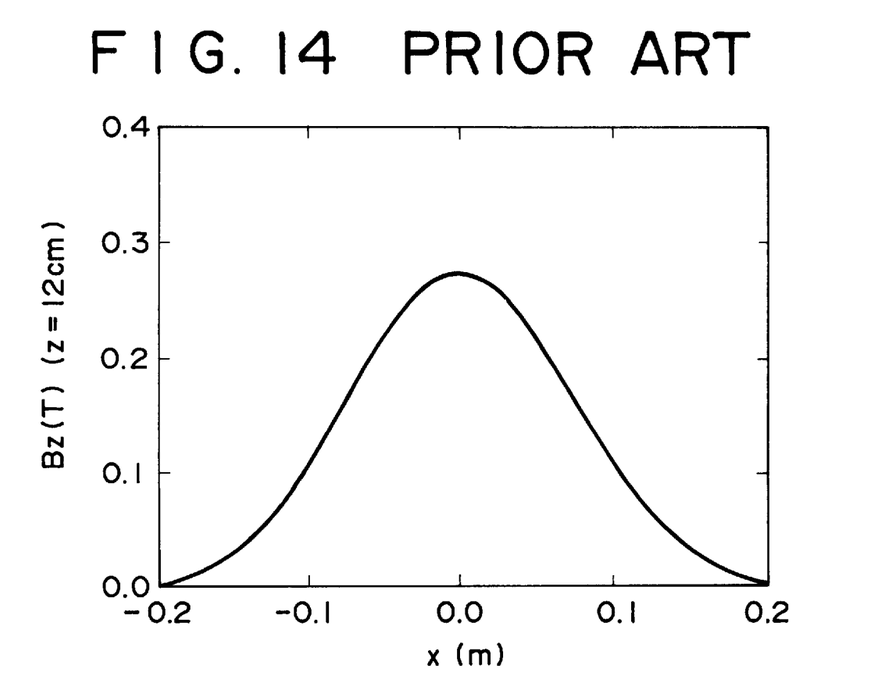
FIG. 14 is a graph showing a trapped magnetic field distribution of the Nd123 superconductive plate of FIG. 9.

JP-A-7-111213 discloses a superconductive magnet using a bulk of a superconductive metal oxide $REBa_2Cu_3O_{7-\delta}$ (RE: a rare earth element; $\delta$: a number representing an oxygen deficiency; this metal oxide is also shown as RE—Ba—Cu—O) containing pinning centers capable of trapping a magnetic field. FIG. 10 shows Jc-B curves of bulks of Y123 and Nd123. These bulks are square plates having a size of 20×20×2 (cm) as shown in FIG. 9 and show the critical current density as shown in FIGS. 11 and 12. The trapped magnetic field distribution at a position spaced apart by 12 cm from the surface of the bulk is shown in FIGS. 13 and 14, from which it will be understood that a strong magnetic field is not obtainable in the case of the bulks of Y123 and Nd123 having a structure shown in FIG. 9.

SUMMARY OF THE INVENTION

It is an object of the present invention to provide a superconductive composite material which gives a strong magnetic field.

Another object of the present invention is to provide a method of fabricating the above composite material.

It is a further object of the present invention to provide a superconductive magnet generating a strong magnetic field.

It is a further object of the present invention to provide a superconductive coil generating a strong magnetic field.

In accordance with the present invention there is provided a composite material comprising a plurality of sections integrated into a unitary structure and each including a bulk of a superconductive metal oxide of RE—Ba—Cu—O wherein RE represents a rare earth element, said bulk of each of said sections having pinning centers and capable of trapping a magnetic field, a first one of said sections having a superconductive current density different from that of a second one of said sections.

In another aspect, the present invention provides a composite material comprising:

a core section having an outer peripheral surface and including a first bulk of a superconductive metal oxide of RE—Ba—Cu—O wherein RE represents a rare earth element, said first bulk having pinning centers and capable of trapping a magnetic field, said first bulk showing a maximum superconductive current density at a relatively high magnetic field; and an outer section surrounding said outer periphery of said core section and including a second bulk of a superconductive metal oxide of RE—Ba—Cu—O wherein RE represents a rare earth element different from that of said first bulk, said second bulk having pinning centers and capable of trapping a magnetic field, said second bulk showing a maximum superconductive current density at a relatively low magnetic field.

In a further aspect, the present invention provides a composite material comprising:

a core section in the form of a layer having opposite sides and including a first bulk of a superconductive metal oxide of RE—Ba—Cu—O wherein RE represents a rare earth element, said first bulk having pinning centers and capable of trapping a magnetic field, said first bulk showing a maximum superconductive current density at a relatively high magnetic field; and two outer sections each in the form of a layer and provided on said opposite sides of said core section, each of said outer sections including a second bulk of a superconductive metal oxide of RE—Ba—Cu—O wherein RE represents a rare earth element different from that of said first bulk, said second bulk having pinning centers and capable of trapping a magnetic field, said second bulk showing a maximum superconductive current density at a relatively low magnetic field.

The present invention also provides a method of producing the above composite material.

The present invention further provides a superconductive coil device comprising a plurality of axially stacked annular bodies of a conductive metal, each of said annular bodies having embedded therewithin (a) at least one, first ring of a first bulk of a superconductive metal oxide of RE—Ba—Cu—O wherein RE represents a rare earth element, said first bulk having pinning centers and capable of trapping a magnetic field, said first bulk showing a maximum superconductive current density at a relatively high magnetic field and (b) at least one, second ring of a second bulk of a superconductive metal oxide of RE—Ba—Cu—O wherein RE represents a rare earth element different from that of said first bulk, said second bulk having pinning centers and capable of trapping a magnetic field, said second bulk showing a maximum superconductive current density at a relatively low magnetic field, said first ring being coaxial with said second ring and located inside of said second ring.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

Figure 1:
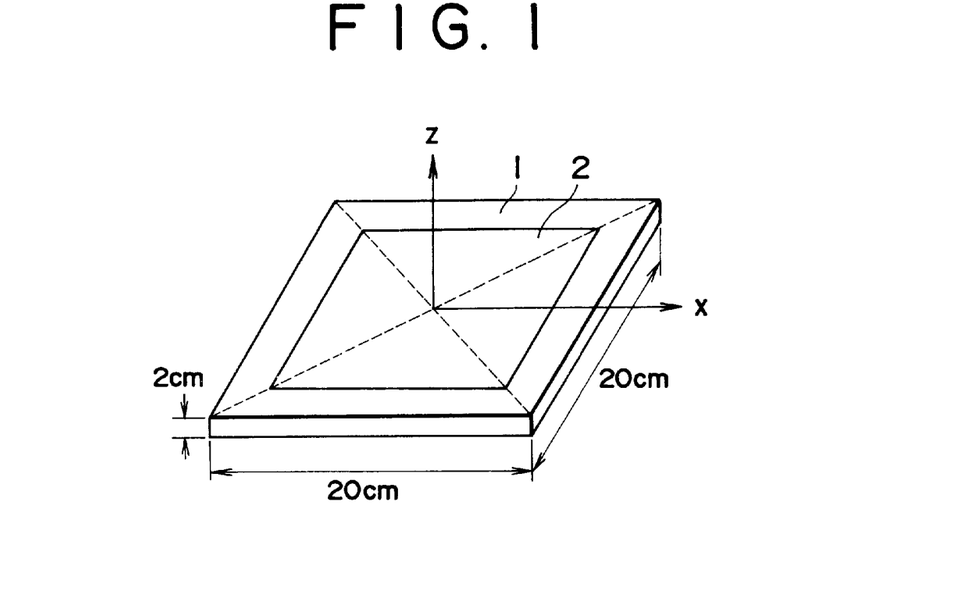
FIG. 1 is a perspective view showing one embodiment of a superconductive composite material according to the present invention.

FIG. 1 schematically depicts an embodiment of a superconductive composite material according to the present invention. Designated as 2 is a square core section including a first bulk of a superconductive metal oxide of $NdBa_2Cu_3O_{7-\delta}$ ($\delta$ is a number representing an oxygen deficiency; this metal oxide is also shown as Nd123 in the present specification). The first bulk has pinning centers and is capable of trapping a magnetic field. The first bulk shows a maximum superconductive current density at a relatively high magnetic field (FIG. 12). Provided around the outer periphery of the core section 1 is an outer section 2 including a second bulk of a superconductive metal oxide of $YBa_2Cu_3O_{7-\delta}$ ($\delta$ is a number representing an oxygen deficiency; this metal oxide is also shown as Y123 in the present specification). The second bulk has pinning centers and is capable of trapping a magnetic field. The second bulk shows a maximum superconductive current density at a relatively low magnetic field (FIG. 11).

Figure 2:
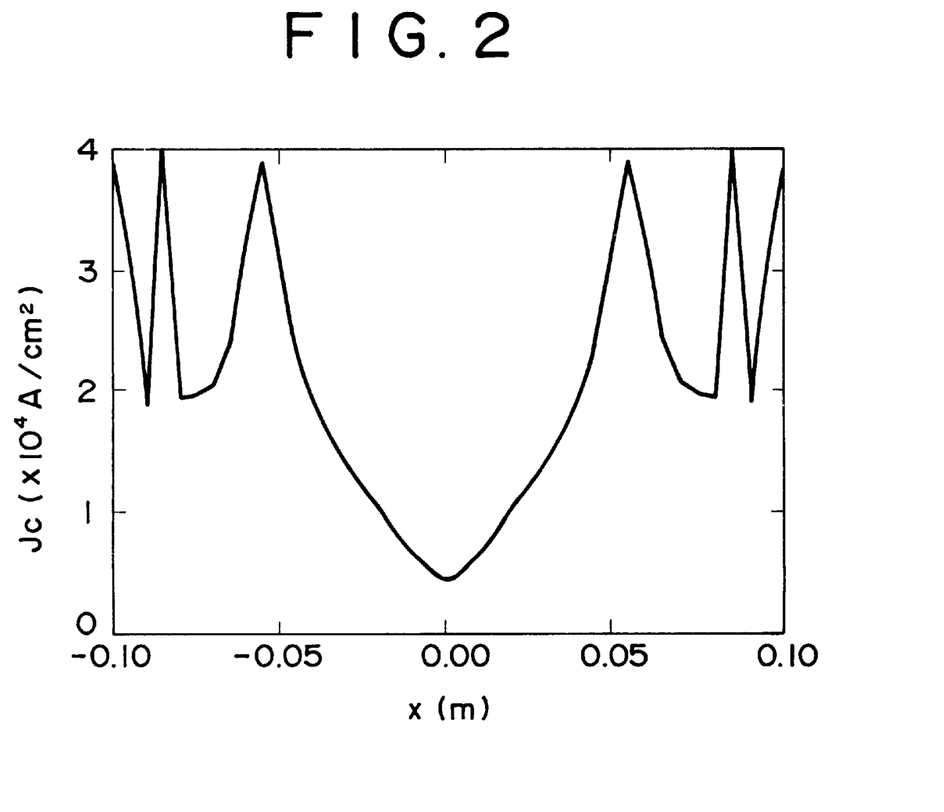
FIG. 2 is a graph showing a critical current density distribution of the composite material of FIG. 1.
Figure 3:
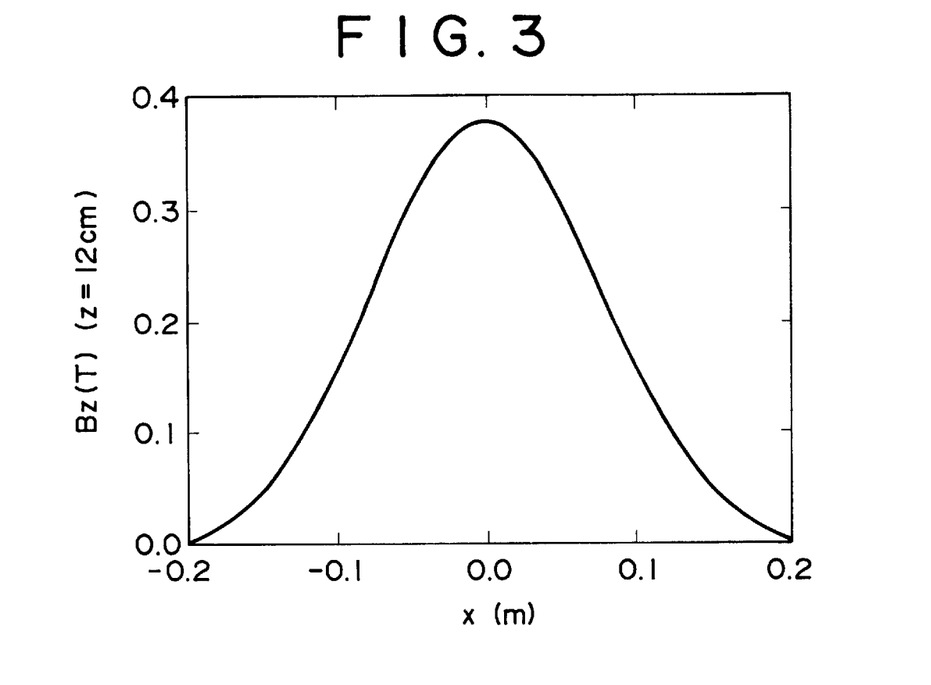
FIG. 3 is a graph showing a trapped magnetic field distribution of the composite material of FIG. 1.
Figure 4:
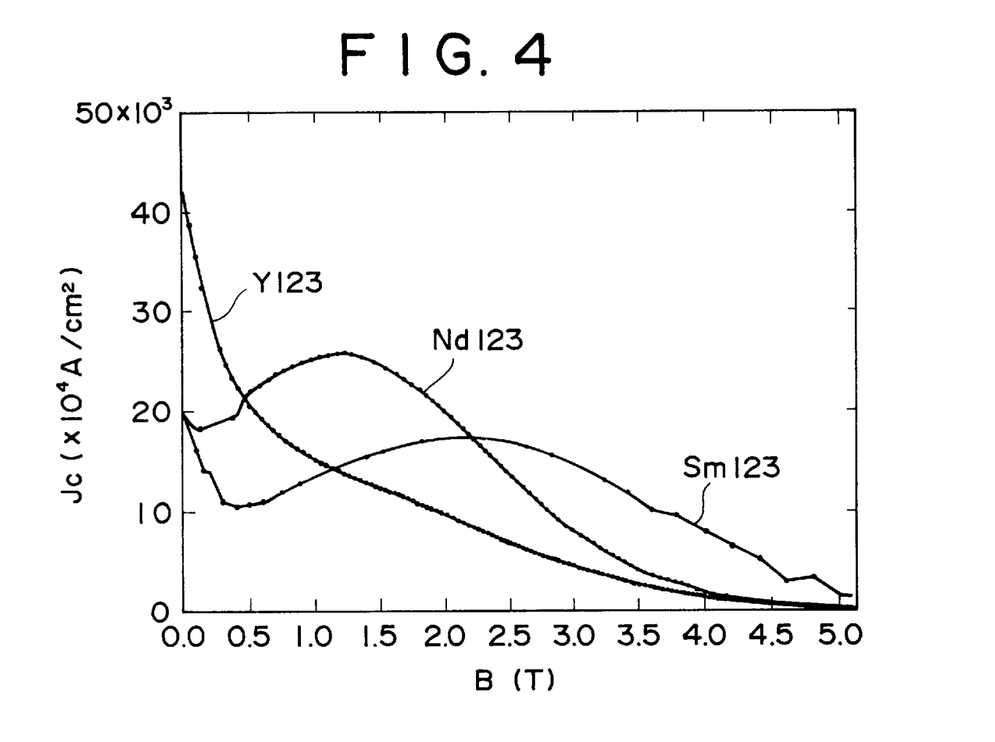
FIG. 4 are Jc-B curves of bulks of Y123, Nd123 and Sm123.

As a result of the above composite structure, the superconductive composite material shown in FIG. 1 shows a critical current density distribution as shown in FIG. 2 and a trapped magnetic field distribution at a position spaced apart by 12 cm from the surface of the composite material as shown in FIG. 4. The maximum intensity of the magnetic field of the composite material of FIG. 1 is 0.38 T which is much greater than those of the conventional structures (0.23 T in the case of the Y123 bulk (FIG. 13) and 0.27 T in the case of the Nd123 bulk (FIG. 14)).

The present invention may be embodied in various forms. For example, while, in the embodiment shown in FIG. 1, the two bulk 1 and 2 directly contact with each other, any suitable material such as a metal or plastic body may be interposed between the two bulks. FIGS. 5–8 show various embodiments according to the present invention.

Figure 5:
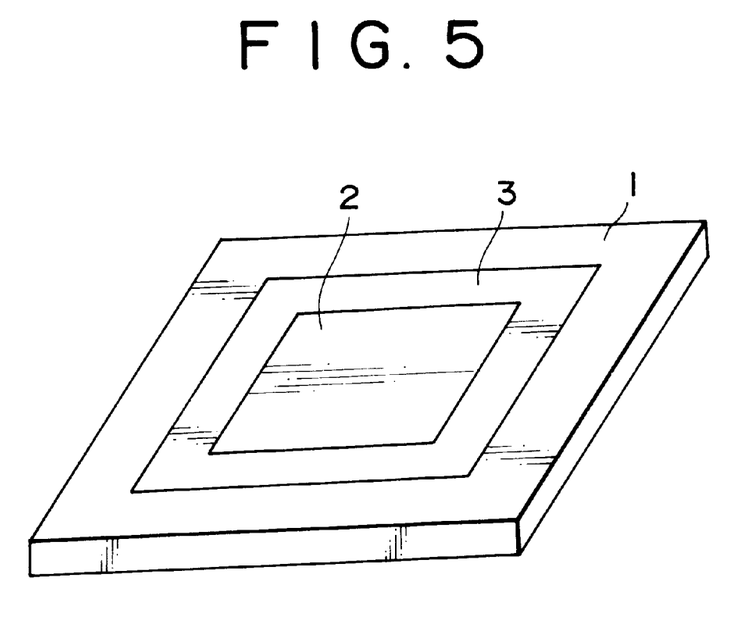
FIG. 5 is a perspective view showing another embodiment of a superconductive composite material according to the present invention.

The composite material shown in FIG. 5 is similar to that shown in FIG. 1 but uses three bulks of Nd123, Sm123 and Y123 superconductive metal oxides 2,3 and 1, respectively, with the Sm123 bulk 3 being interposed between the core Nd123 bulk 2 and the outer Y123 bulk. The magnetic field dependency of the critical current density of the bulks 2,3 and 1 is shown in FIG. 4.

The superconductive composite material according to the present invention is suitably applied as a superconductive magnet in a manner known per se. Thus, the composite material is exposed to a magnetic field at a temperature higher than the critical temperature Tc thereof and is then cooled to a temperature lower than Tc in the magnetic field. Thereafter, the application of the magnetic field is stopped. Alternatively, the composite material is first cooled to a temperature lower than Tc and is then instantaneously (in a pulse-like mode) exposed to a high magnetic field. In either case, the magnetic field is trapped in the pinning centers of the bulks to provide the superconductive magnet.

Figure 6:
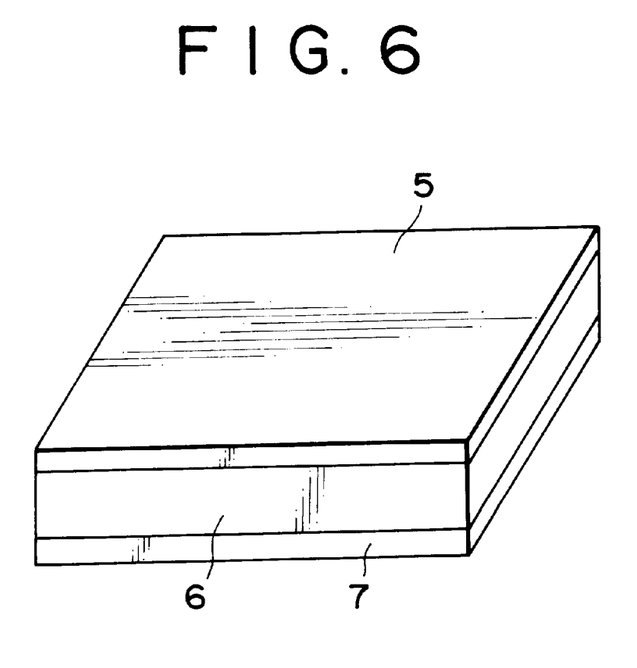
FIG. 6 is a perspective view showing a further embodiment of a superconductive composite material according to the present invention.

In the embodiment shown in FIG. 6, designated as 6 is a core layer including a bulk of Nd123. Two outer layers 5 and 7 each including a bulk of Y123 are provided on both sides of the core layer 6. If desired, the composite material can be shaped in the form of a rod, column or tube.

The composite material according to the present invention such as shown in FIGS. 1, can be fabricated as follows. First, a required number of core and outer sections of bulks are prepared separately. The sections are then assembled into a unitary structure. Alternatively, a core section is first prepared. The core section is then immersed in a solution to grow crystal of a superconductor for an outer section with the core section functioning as a seed crystal. The grown crystal is cut and/or ground to form an outer section.

Figure 7:
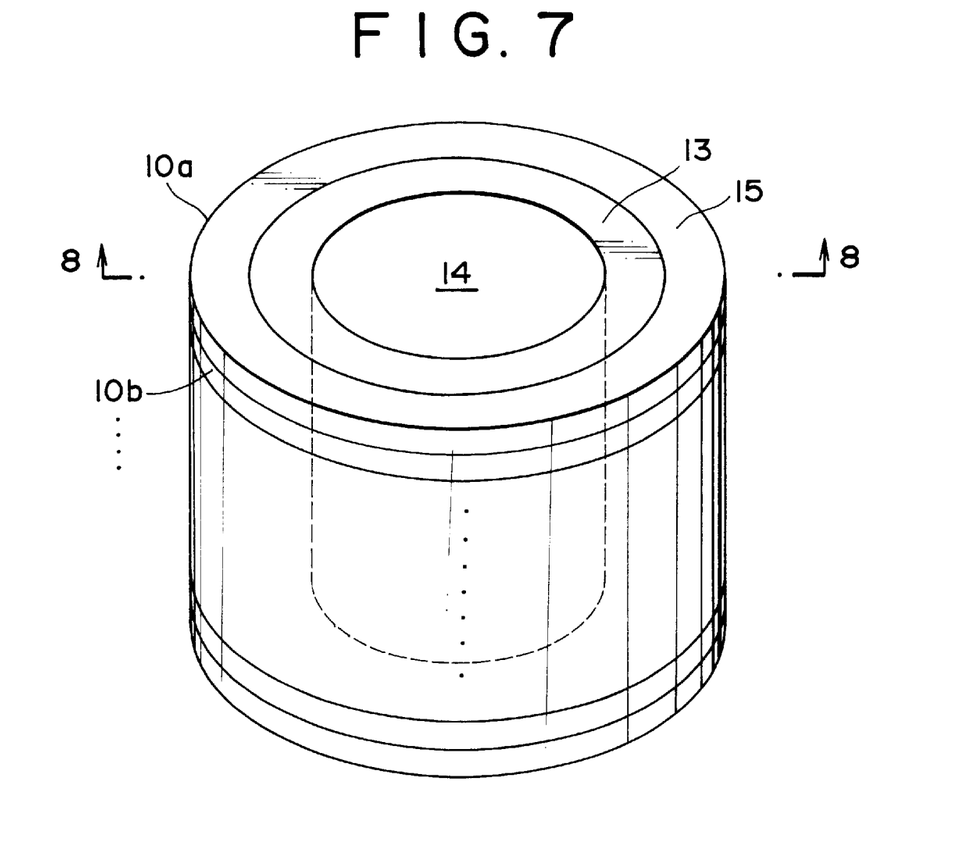
FIG. 7 is a perspective view diagrammatically showing one embodiment of a superconductive coil according to the present invention.
Figure 8:
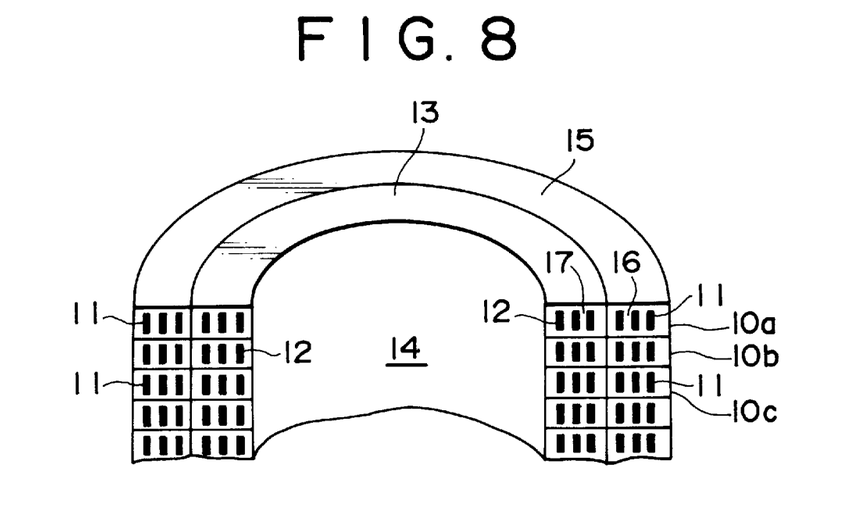
FIG. 8 is a fragmentary perspective view of the superconductive coil of FIG. 7 cut along a line A—A in FIG. 7.

FIGS. 7 and 8 depict a further embodiment of the present invention for use as a superconductive coil. The superconductive coil includes a plurality of annular bodies 10a, 10b, 10c . . . axially stacked to form a hollow center space 14. Each of the annular bodies 10a, 10b, 10c . . . is composed of inner and outer sections 13 and 15. As shown in FIG. 8, the inner section 13 of each of the annular bodies has at least one, first ring 12 (three coaxial rings in the illustrated case) of Nd123 embedded in a matrix 17 of a conductive metal such as Cu, while the outer section 15 has at least one, second ring 11 (three coaxial rings in the illustrated case) of Y123 embedded in a matrix 16 of a conductive metal such as Cu. It is without saying that each of the annular bodies 10a, 10b, 10c . . . can be formed of a common matrix of a conductive metal in which one or more of the inner rings 12 and one or more of the outer rings 11 are embedded.

It is not essential that the superconductive rings 11 and 12 in each annular body shown in FIGS. 7 and 8 be completely surrounded by the Cu matrix. The rings 11 and 12 may be simply fitted into grooves formed on surfaces of Cu annular bodies.

The above superconductive coil may be magnetized in any known manner and can give a homogeneous high intensity magnetic field.

The superconductive composite material according to the present invention can be utilized as a superconductive magnet or superconductive coil for various applications such as magnetically levitated trains, catapults and transporters, elevators for multistoried buildings, superconductive electromagnetic marine propulsion systems, superconductive motors, superconductive generators, magnetic separators, magnetic bearings, flywheels for superconducting magnetic energy storage, accelerators and NMR.

The following example will further illustrate the present invention.

EXAMPLE

A superconductive composite material having a structure shown in FIG. 1 was prepared. First, according to the OCMG process (oxygen Controlled-Melt-Growth process) disclosed in, for example, JP-A-7-187671, JP-A-7-232917 and Applied Physics, vol. 64, No. 4, 368–371 (1995), a bulk of Nd123 was prepared by blending $Nd_2O_3$, $BaCO_3$ and CuO powder in amounts providing a Nd:Ba:Cu ratio of 1:2:3. The blend was calcined at 900° C. for 24 hours and then melted in a platinum mortar at 1400° C. for 20 minutes. The melt was shaped into a plate between copper hammers with cooling. The plate was ground and the ground particles were molded into a plate having a size of 16×16×2 cm. The molded plate was heated at 1,120° C. for 20 minutes and then cooled to 1,080° C. through 20 minutes and to 950° C. at a rate of 1° C./hour while maintaining the oxygen partial pressure at 0.01 atm.

Next, according to the MPMG process (Melt-Powder-Texture-Growth process) disclosed in, for example, JP-A-

5-279032, JP-A-5-279034, JP-B-7-51463 and "Melt Processed High-Temperature Superconductors", World Scientific, edited by Masato Murakami, a bulk of Y123 was formed around the above Nd123 bulk. Powders of $Nd_2O_3$, $BaCO_3$ and CuO were blended in amounts providing a Y:Ba:Cu ratio of 1.8:2.4:3.4. The blend was calcined at 900° C. for 24 hours and then melted in a platinum mortar at 1400° C. for 20 minutes. The melt was shaped into a plate between copper hammers with cooling. The plate was ground and the ground particles were mixed with 10% by weight of $Ag_2O$ powder (based on the weight of the ground particles). The mixture was placed around the above Nd123 bulk and molded to form a composite plate having a size of 20×20×2 cm. The composite plate was heated at 1,040° C. for 30 minutes and then cooled to 980° C. through 10 minutes and to 900° C. at a rate of 1° C./hour. After being allowed to be cooled to room temperature, the composite plate was heated at 500–600° C. in an oxygen stream at an oxygen pressure of 1 atm. This was then allowed to be cooled to room temperature, thereby obtaining a superconductive composite material. In general, Y123 is formed at about 1,000° V in air. By the incorporation of Ag, the melting point decreases by about 40° C. (from 1,000° C. to 960° C.). Since Nd123 phase is formed at 1,090° C. in air, the above heat treatment does not cause a change in the core Nd123.

For the purpose of the present invention, any suitable known process for preparing a bulk of superconductive oxide having pinning centers and capable of trapping a magnetic field, other than the above-described OCMG and MPMG processes, may be used.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A composite material comprising a plurality of bulk superconductor sections integrated into a unitary structure, each of said sections including a bulk of a superconductive metal oxide of RE—Ba—Cu—O, wherein RE represents a rare earth element, said bulk of each of said sections having pinning centers and capable of trapping a magnetic field, a first one of said sections having a superconductive current density different from that of a second one of said sections.

2. A composite material as claimed in claim 1, wherein said rare earth element RE in said first section is different from that in said second section.

3. A composite material as claimed in claim 1, wherein said first section shows a maximum superconductive current density at a relatively high magnetic field and said second section shows a maximum superconductive current density at a relatively high magnetic field.

4. A composite material comprising:
a core section having an outer peripheral surface and including a first bulk of a superconductive metal oxide of RE—Ba—Cu—O wherein RE represents a rare earth element, said first bulk having pinning centers and capable of trapping a magnetic field, said first bulk showing a maximum superconductive current density at a relatively high magnetic field; and
an outer section surrounding said outer periphery of said core section and including a second bulk of a superconductive metal oxide of RE—Ba—Cu—O wherein RE represents a rare earth element different from that of said first bulk, said second bulk having pinning centers and capable of trapping a magnetic field, said second bulk showing a maximum superconductive current density at a relatively low magnetic field.

5. A composite material as claimed in claim 4, wherein said first bulk is Nd—Ba—Cu—O, and said second bulk is Y—Ba—Cu—O.

6. A composite material comprising:
a core section in the form of a layer having opposite sides and including a first bulk of a superconductive metal oxide of RE—Ba—Cu—O wherein RE represents a rare earth element, said first bulk having pinning centers and capable of trapping a magnetic field, said first bulk showing a maximum superconductive current density at a relatively high magnetic field; and
two outer sections each in the form of a layer and provided on said opposite sides of said core section, each of said outer sections including a second bulk of a superconductive metal oxide of RE—Ba—Cu—O wherein RE represents a rare earth element different from that of said first bulk, said second bulk having pinning centers and capable of trapping a magnetic field, said second bulk showing a maximum superconductive current density at a relatively low magnetic field.

7. A composite material as claimed in claim 6, wherein said first bulk is Nd—Ba—Cu—O, and said second bulk is Y—Ba—Cu—O.

8. A method of producing a composite material according to claim 1, comprising the steps of:
preparing said plurality of sections separately; and
assembling said plurality of sections into said unitary structure.

9. A method of producing a composite material according to claim 4, comprising the steps of:
preparing said core section;
immersing said core section in a solution to grow crystal of said Y—Ba—Cu—O superconductive on said core section; and
trimming said crystal to form said outer section.

10. A method of producing a composite material according to claim 6, comprising the steps of:
preparing said core section;
immersing said core section in a solution to grow a crystal layer of said Y—Ba—Cu—O superconductive on each of the opposite sides of said core section; and
trimming said crystal layers to form said outer sections.

11. A superconductive magnet comprising a composite material according to claim 1 and means for magnetizing said composite material.

12. A superconductive coil device comprising a plurality of axially stacked annular bodies of a conductive metal, each of said annular bodies having embedded therewithin (a) at least one, first ring of a first bulk of a superconductive metal oxide of RE—Ba—Cu—O wherein RE represents a rare earth element, said first bulk having pinning centers and capable of trapping a magnetic field, said first bulk showing a maximum superconductive current density at a relatively high magnetic field and (b) at least one, second ring of a second bulk of a superconductive metal oxide of RE—Ba—Cu—O wherein RE represents a rare earth element different from that of said first bulk, said second bulk having pinning centers and capable of trapping a magnetic field, said second bulk showing a maximum superconductive current density at a relatively low magnetic field, said first ring being coaxial with said second ring and located inside of said second ring.

13. A superconductive coil device as claimed in claim 12, wherein said first bulk is Nd—Ba—Cu—O, and said second bulk is Y—Ba—Cu—O.

* * * * *